US008274121B2

(12) United States Patent
Vorhaus

(10) Patent No.: US 8,274,121 B2
(45) Date of Patent: Sep. 25, 2012

(54) COMPOUND FIELD EFFECT TRANSISTOR WITH MULTI-FEED GATE AND SERPENTINE INTERCONNECT

(75) Inventor: James L. Vorhaus, Chapel Hill, NC (US)

(73) Assignee: Sarda Technologies, Inc., Durham, NC (US)

( * ) Notice: Subject to any disclaimer, the term of this patent is extended or adjusted under 35 U.S.C. 154(b) by 0 days.

(21) Appl. No.: 13/270,145

(22) Filed: Oct. 10, 2011

(65) Prior Publication Data
US 2012/0086497 A1 Apr. 12, 2012

Related U.S. Application Data

(63) Continuation of application No. 13/205,433, filed on Aug. 8, 2011.

(60) Provisional application No. 61/372,513, filed on Aug. 11, 2010.

(51) Int. Cl.
*H01L 29/20* (2006.01)

(52) U.S. Cl. ........ 257/401; 257/279; 257/289; 438/284; 438/286

(58) Field of Classification Search .................. 438/284, 438/286; 257/279, 289, 401
See application file for complete search history.

(56) References Cited

U.S. PATENT DOCUMENTS

| 5,258,638 A * | 11/1993 | Elhatem et al. | 257/401 |
| 5,721,144 A * | 2/1998 | Hsieh et al. | 438/6 |
| 5,789,791 A * | 8/1998 | Bergemont | 257/401 |
| 5,801,091 A * | 9/1998 | Efland et al. | 438/622 |
| 5,955,763 A * | 9/1999 | Lin | 257/355 |
| 6,900,482 B2 * | 5/2005 | Aoki et al. | 257/275 |
| 7,132,717 B2 * | 11/2006 | Su et al. | 257/401 |
| 7,952,117 B2 * | 5/2011 | Masuda | 257/192 |
| 8,097,906 B2 * | 1/2012 | Takagi | 257/287 |
| 2002/0014670 A1 * | 2/2002 | Litwin | 257/401 |
| 2012/0086497 A1 * | 4/2012 | Vorhaus | 327/427 |

* cited by examiner

*Primary Examiner* — Eugene Lee
(74) *Attorney, Agent, or Firm* — Carr & Ferrell LLP

(57) ABSTRACT

Aspects provide for reducing the size and cost of a compound semiconductor power FET device while increasing yield and maintaining current handling capabilities of the FET by distributing portions of the current in parallel to sections the source and drain fingers to maintain a low current density, and applying the gate signal to both ends of the gate fingers to increase yield. The current to be handled by the FET may be divided among a set of electrodes arrayed along the width of the source or drain fingers and oriented to cross the fingers along the length of the source and drain fingers. The current may be conducted from the electrodes to the source and drain fingers through vias disposed along the surface of the fingers. Heat developed in the source, drain, and gate fingers may be conducted through the vias to the electrodes and out of the device.

24 Claims, 12 Drawing Sheets

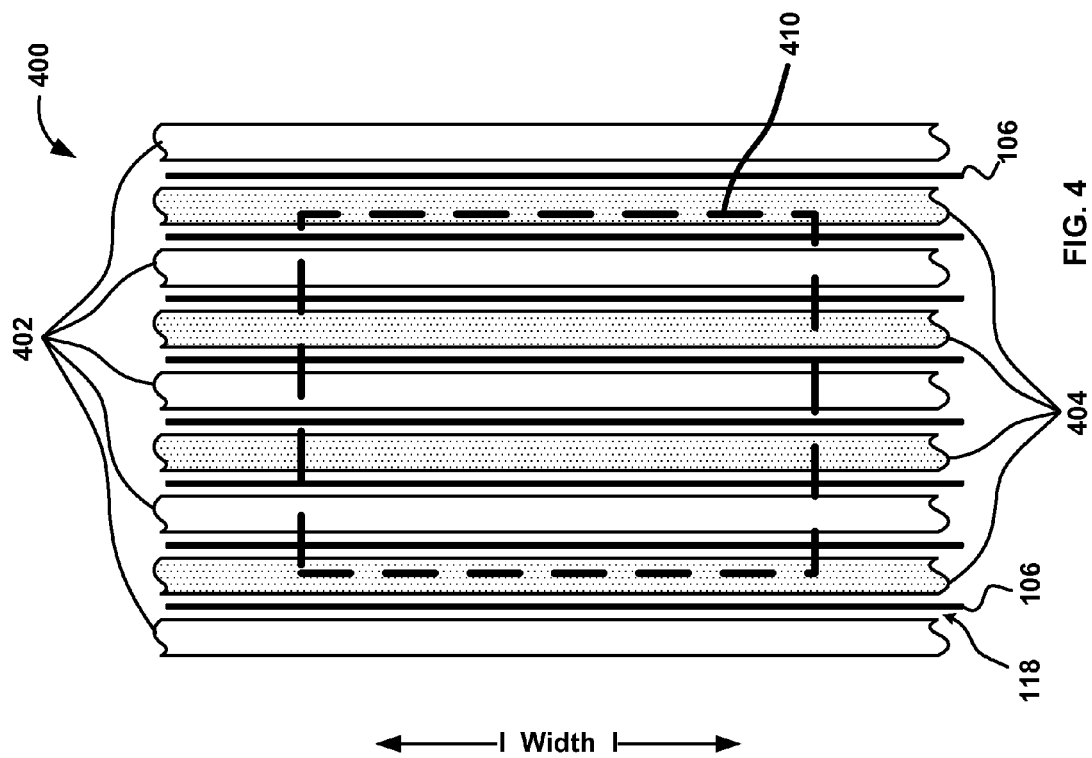
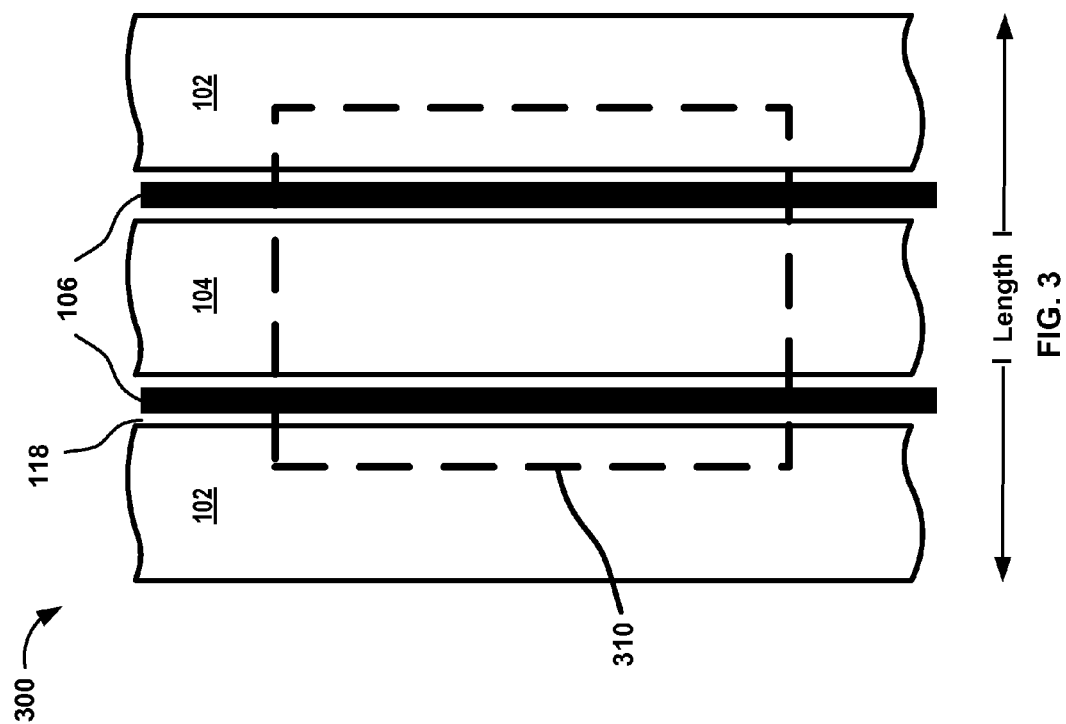

COMPOUND FIELD EFFECT TRANSISTOR WITH MULTI-FEED GATE AND SERPENTINE INTERCONNECT

CROSS REFERENCE TO RELATED APPLICATIONS

This continuation application claims the priority benefit of U.S. patent application Ser. No. 13/205,433, filed Aug. 8, 2011, and titled "LOW INTERCONNECT RESISTANCE INTEGRATED SWITCHES," which claims the priority benefit of U.S. provisional application number 61/372,513, filed Aug. 11, 2010, and titled "Field Effect Transistor and Method of Making Same." The above referenced applications are hereby incorporated by reference in their entirety.

TECHNICAL FIELD

The present invention relates to semiconductors devices, and more particularly to compound semiconductor Field Effect Transistor switches and power FETs.

BACKGROUND

A common type of Field Effect Transistors (FET) is a Metal-Oxide-Semiconductor Field Effect Transistor (MOSFET), which may be fabricated using silicon. A FET may also be fabricated using germanium or a compound semiconductor such as gallium arsenide (GaAs) or gallium nitride (GaN). FET devices fabricated from compound semiconductors such as GaAs make very good switches and signal amplification devices for rf and microwave applications. Among these devices are switches and large-signal (or power) amplifier circuits. Some advantages of compound semiconductor FET switches over silicon MOSFET switches include high blocking (off-state) resistance, low on-state resistance (RDs (on)), fast switching speed, high current density, low temperature coefficient, high junction temperature and, for GaN devices, high breakdown voltage. Unfortunately, compound semiconductor FET switches and power FETs are also more expensive to manufacture than silicon MOSFETs due to the larger size of the FETs necessary to handle power, smaller wafers and higher fabrication expenses. Merely decreasing the size of compound semiconductors by scaling down the device may not decrease costs.

SUMMARY

Device cost of a compound semiconductor switching or power FET is driven by two factors, namely size and yield. The present invention addresses both. Reducing the size while maintaining current handling capabilities is accomplished by distributing portions of the current handled by the device in parallel to sections the source and drain fingers to maintain a low current density and eliminate outboard bonding pads. Increasing yield is accomplished by applying the gate signal to both ends of the gate fingers, which eliminates a major source of device failure, i.e., a break in any single one of the many gate fingers. The current to be handled by the FET may be divided among a set of electrodes arrayed along the width of the source or drain fingers. The electrodes may be oriented to cross the fingers along the length of the array of source and drain fingers. The portion of the current distributed to each source electrode may be coupled to a section of each source finger crossed by the source electrode. Similarly, the portion of the current distributed to each drain electrode may be applied to a section of each drain finger crossed by the drain electrode. The current may be conducted from the source and drain electrodes to the source and drain fingers, respectively, through vias disposed along the surface of the fingers. Heat developed in the source, drain, and gate fingers may be conducted through the vias to the electrodes and out of the device.

Various aspects of a means for switching current using a Field Effect Transistor comprises a means for segmenting source current and a means for distributing segments of the segmented source current to sections of a source finger disposed on a surface of a gallium arsenide semiconductor. The FET means further includes a means for segmenting drain current and a means for distributing segments of the segmented drain current to sections of a drain finger disposed on the surface of the gallium arsenide, and a means for coupling a gate signal to two ends of a gate finger disposed between the source element and the gate element.

Various embodiments of a Field Effect Transistor device comprises a compound semiconductor substrate, a plurality of source fingers disposed on a surface of the substrate and a plurality drain fingers disposed on the surface of the substrate and alternating with the source fingers. The FET device further comprises a plurality of gates disposed between adjacent source fingers and drain fingers. The FET device also includes a plurality of first gate pads each configured to couple a gate signal to a first end of at least one of the gate fingers and a plurality of second gate pads each configured to couple the gate signal to a second end of at least one of the gate fingers. A dielectric layer may be disposed on the source fingers, drain fingers and gate fingers. A plurality of source electrodes may be disposed on the dielectric layer along a width of the source fingers and oriented to cross the plurality of source fingers, each electrode electrically coupled through at least one via in the dielectric layer to a section of each of the source fingers. A plurality of drain electrodes may be disposed on the dielectric layer along a width of the drain fingers and oriented to cross the plurality of drain fingers, each electrode electrically coupled through at least one via in the dielectric layer to a section of each of the drain fingers.

Various aspects of a method for switching current using a Field Effect Transistor comprises partitioning source current into a plurality of source current segments for distribution along a width of a source element of the Field Effect Transistor and distributing the plurality of source current segments to sections of the source element through a plurality of source electrodes, each electrode in electrical contact with at least one of a plurality of vias distributed along a surface of the source element. The method further comprises partitioning drain current into a plurality of drain current segments for distribution along a width of a drain element of the Field Effect Transistor, the drain element disposed adjacent the source element and distributing the plurality of drain current segments to sections of the drain element through a plurality of drain electrodes, each electrode in electrical contact with at least one of a plurality of vias distributed along a surface of the drain element. The method also includes coupling a gate signal to a first and second end of a gate finger disposed between the adjacent source and gate elements, and switching current between the source element and the drain element using the gate signal coupled to the ends of the gate finger.

In various embodiments, the Field Effect Transistor device comprises a compound semiconductor layer, a first and second source finger disposed on a surface of the compound semiconductor layer and a first and second drain finger disposed on the surface of the compound semiconductor layer, and alternating with the first and second source finger. A plurality of gate fingers are disposed on the surface of the compound semiconductor layer. Each gate finger is disposed between an adjacent source finger and drain finger. Each drain finger has a first and second end. The first end of each gate finger is electrically coupled to a gate signal through a first pad and the second end of each gate finger electrically coupled to the gate signal through a second pad. The FET device further includes a plurality of first source vias distributed along a width of the first source finger and a plurality of second source vias distributed along a width of the second source finger. The first and second source vias are configured to partition source current along the width of the first and second source finger, respectively. The FET device further includes a plurality of source conductors distributed along the width of the first and second source finger, each source conductor in electrical contact with the first source finger through at least one of the first source vias and with the second source finger through at least one of the second source vias. A plurality of first drain vias may be distributed along a width of the first drain finger and a plurality of second drain vias may be distributed along a width of the second drain finger, the first and second drain vias configured to partition drain current along the width of the first and second drain finger, respectively. A plurality of drain conductors may be distributed along the width of the first and second drain finger, each drain conductor in electrical contact with the first drain finger through at least one of the first drain vias and with the second drain finger through at least one of the second drain vias.

BRIEF DESCRIPTION OF THE DRAWINGS

FIG. 3 is a plan view illustrating a typical unit cell of section of active device area of the FET of FIG. 1.

FIG. 4 illustrates a unit cell of a section of a reduced size for a compound semiconductor FET, in accordance with embodiments of the technology.

DETAILED DESCRIPTION

Figure 1:
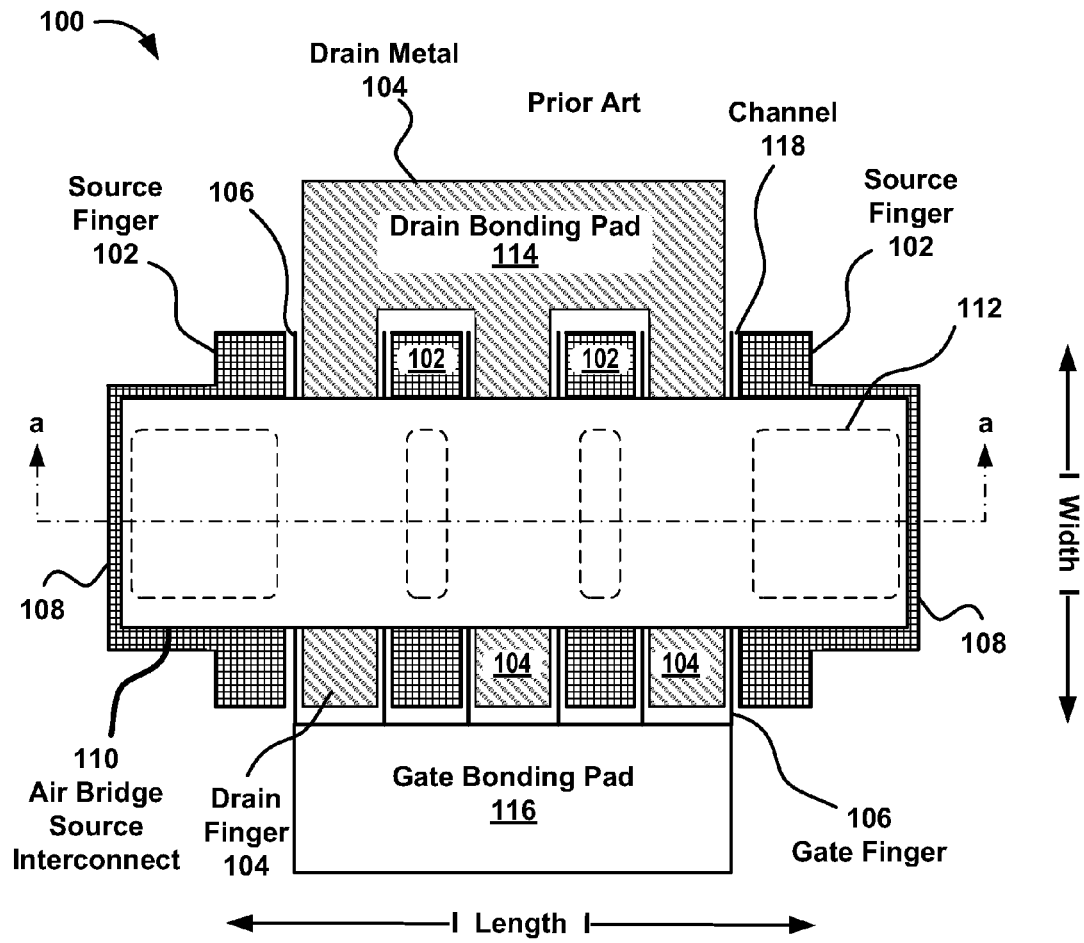
FIG. 1 shows a block diagram a conventional layout for a prior art large periphery power FET.
Figure 2:
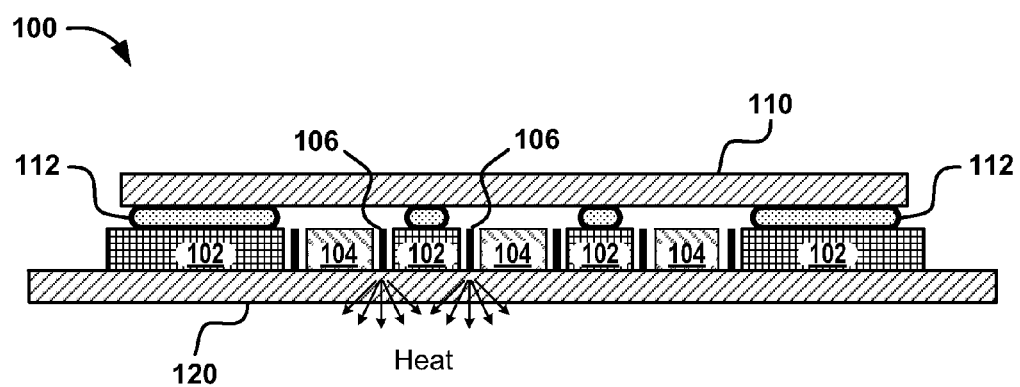
FIG. 2 is a cross section view of the FET of FIG. 1 along line a-a.

FIG. 1 shows a block diagram of a conventional layout for a prior art large periphery power FET 100. FIG. 2 is a cross section view of the FET 100 of FIG. 1 along line a-a. The FET 100 includes source fingers 102, drain fingers 104 and gate fingers 106. The source fingers 102 and drain fingers 104 may be ohmic metal fabricated on a N-type or P-type semiconductor 120, (or compound semiconductor epitaxial layer) which is disposed on a semi-insulating substrate (not illustrated) such as silicon or GaAs. The term ohmic metal is used to refer specifically to source metal, which is metal used in source fingers, and to drain metal, which is metal used in drain fingers. Source and drain metal may be in low resistance contact with the compound semiconductor epitaxial layer. This may be achieved by depositing a specific set of materials (e.g., Au, Ge, and/or Ni) then heating the wafer so that the metals alloy (or diffuse) into the epitaxial layer creating the low resistance connections. In some embodiments, gate metal, which is used in gate fingers comprises a set of deposited metals (e.g., Ti, Pt, Au, and/or Al). Gate metal forms a Schottky contact with the surface of the epitaxial layer, creating the Schottky diode structure in the region of epitaxial layer that comprises the gate region.

In operation, current flows between the source fingers 102 and the drain fingers 104. The amount of current flowing is controlled by a voltage applied to the gate fingers 106. The FET 100 further includes a drain bonding pad 114, source bonding pad 108, and a gate bonding pad 116. An air bridge 110 provides interconnections between the source fingers 102, through contacts 112 to the source fingers 102 and to the source bonding pads 108. The contacts 112 are shown in dotted line to indicate that they are between the air bridge 110 and the source fingers 102 or source pad 108. A length of the source fingers 102, drain fingers 104, and gate fingers is measured in the horizontal axis as illustrated FIG. 1 and is generally the short dimension. A width of the source fingers 102, drain fingers 104, and gate fingers is measured in the vertical axis as illustrated FIG. 1 and is generally the long dimension. A "gate periphery" may be a measurement of an active area of a FET (or an active region of the FET under consideration). The gate periphery is generally a number of gate fingers distributed along the length of the device (the horizontal axis in FIG. 1) times the width of the gate fingers (in the long axis or vertical axis of FIG. 1). For example, a FET (or a region of a FET) that has 100 gate fingers, each 1 mm in width, has a gate periphery of 100 mm.

A device such as the FET 100 has a large footprint requiring a great deal of expensive wafer surface. This large die size is generally driven by a number of factors: The first factor is a requirement for many source and drain fingers 104 in the active area of the device to support a large gate periphery. The second factor is a requirement that the drain fingers 104 are large enough to conduct current without failing due to generating too much heat. The third factor is that the length of the source fingers 102 is driven by the process technology used to form the air bridge, thus, source fingers 102 must be large enough to accommodate the contacts 112 to the air bridge 110. The fourth factor is a requirement for large outboard bonding pads, e.g., the drain bonding pad 114, the source bonding pads 108, and the gate bonding pad 116.

FIG. 3 is a plan view illustrating a typical unit cell 310 of section 300 of active device area of the FET 100 of FIG. 1. The source fingers 102 and drain fingers 104 are 30 microns each in length and the channels 118 in which the gate fingers 106 are positioned are 5 microns in length. Thus, an example unit cell 310 of the device (represented by a dotted line rectangle) having a 70 micron length×100 micron width (7,000 sq. microns) would encompass two gates, each 100 microns wide, or 200 microns of gate periphery or "active" device area.

GaAs devices typically have a specific resistivity of around one ohm-mm, so in order to achieve on-state resistances in the milliohm range, very large FETs, with gate peripheries on the order of hundreds of millimeters, are required. This large gate periphery is the major yield driver (and major cost factor) in the manufacturing of such devices. Thus, a device as illustrated in FIG. 3 might require about 7,000,000 square microns (7 mm$^2$) of active device area, in addition to peripheral bonding pads to achieve 200 mm of gate periphery.

FIG. 4 illustrates a unit cell 410 of a section 400 of a reduced size for a compound semiconductor FET, in accordance with embodiments of the technology. The size of a compound semiconductor FET device may be reduced by reducing widths of the source fingers 402 and drain fingers 404 as illustrated in FIG. 4. For example, a source finger 402 and a drain finger 404, each having a length of about 7 microns may produce about three times the gate periphery in about the same size unit cell 410 (about 72×100 microns as illustrated in FIG. 4). Note that it may not be practical to shrink the length of the channel 118 in proportion to the unit cell because of various device performance restrictions such as breakdown voltage. Note also that because of the symmetrical nature of the ohmic metal structure of a FET, source and drain fingers may be interchangeable. The embodiment illustrated in FIG. 4 may achieve 600 mm of gate periphery in the unit cell 410 which is about same size as the unit cell 310.

As it turns out, there are a number of barriers to simply scaling a FET device such as illustrated in the section 300 of FIG. 3 down to a FET device as illustrated in the section 400 of FIG. 4. As discussed above, there is a limit to how much the length the drain fingers 104 can be reduced and still carry adequate current from the bonding pad 114 through the entire width of the drain fingers 104. As the cross section of source fingers 102 and the drain fingers 104 decreases metal migration occurs in the direction of the current, further decreasing the cross section. Further, as the cross section of the fingers decrease the resistance in the fingers increases. A practical limit for reduction of the length of the source fingers and the drain fingers 104 is about 30 microns.

Moreover, there are additional limits to simply scaling down various component parts of a FET device. For example, scaling down the length of the gate fingers 106 can result in an increase in defect rates due to breaks in the fingers 106. This in turn can reduce yield. It turns out that as the length of the gate fingers is reduced, the probability of a break in the gate fingers 106 increases. For example, a reduction in length of the gate fingers 106 to about 0.25-0.5 microns could substantially decrease a yield for a FET device having a 1 meter gate, to less than 40%. While, reducing the length of the gate fingers 106 may have limited bearing on the total size of a FET, there may be other reasons for wishing to decrease the length.

Another limit to scaling down a FET device turns out to be a limitation on spacing between gate fingers 106 (gate pitch) imposed by temperature control. Most of the heat is generated in the FET device 100 and is generated under the gates 106 and is conducted out of the device through the semiconductor 120 and the substrate. A compound semiconductor such as GaAs is a rather poor thermal conductor. The heat tends to propagate in a spreading action away from gates 106 through the semiconductor 120 and substrate at about 45 degrees, as illustrated in FIG. 2. The heat spreading action tends to increase the area through which heat is removed from the gate region and improves efficiency for removing heat from the gate region. However, as the FET device is scaled down, heat propagating at 45 degrees from adjacent gate fingers 106 interferes with the spreading action, and efficiency of the conduction of heat through the semiconductor 120 and substrate decreases. Yet another barrier is that the air bridge 110 illustrated in FIG. 1 is precluded because of the narrow source fingers 402.

Figure 5:
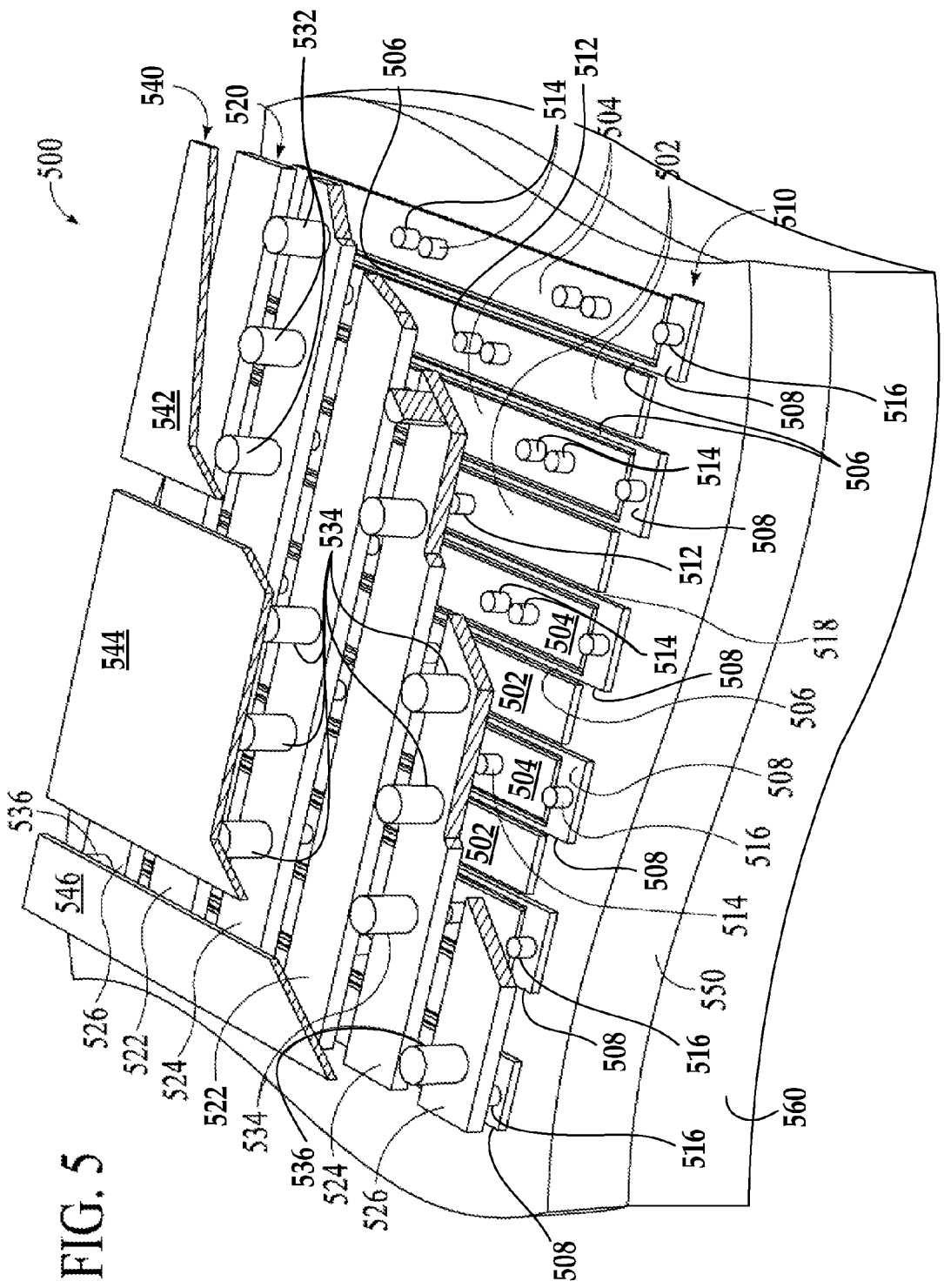
FIG. 5 is a perspective cutaway view of a block diagram for a FET device according to various aspects of the technology.
Figure 6:
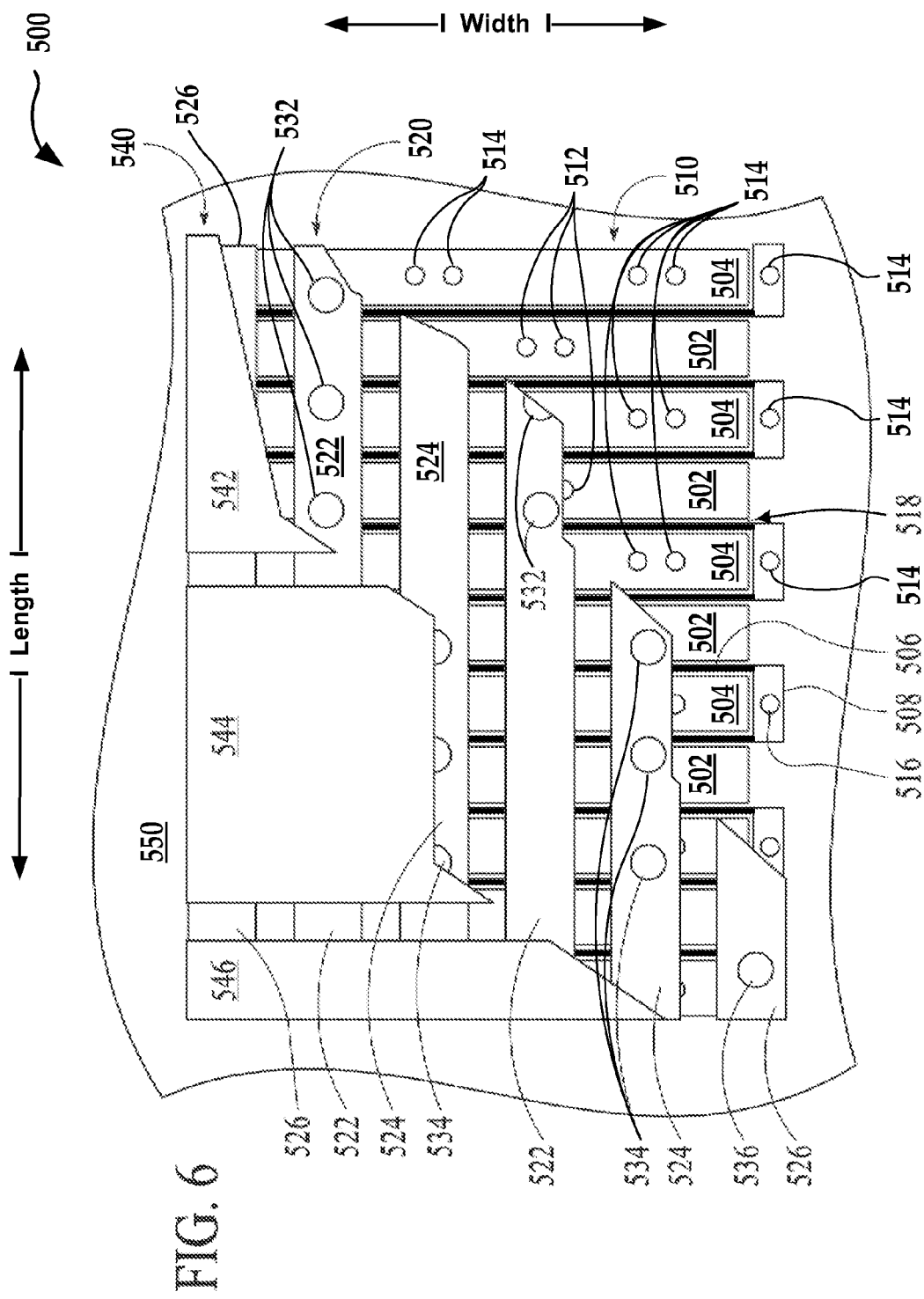
FIG. 6 is a top plan view of the cut-away of the FET device of FIG. 5.
Figure 7:
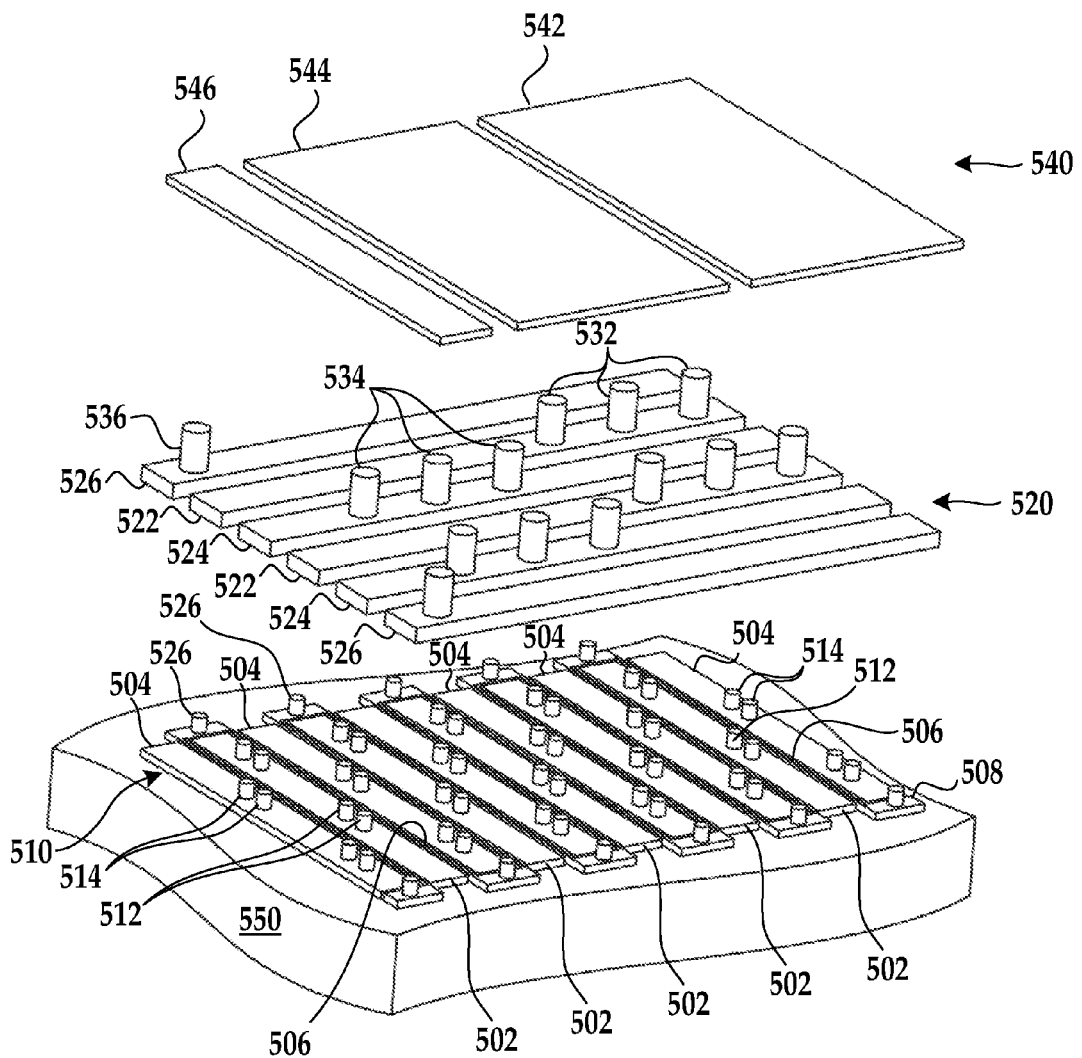
FIG. 7 is an exploded view without cutaway of the FET device of FIG. 5.
Figure 14:
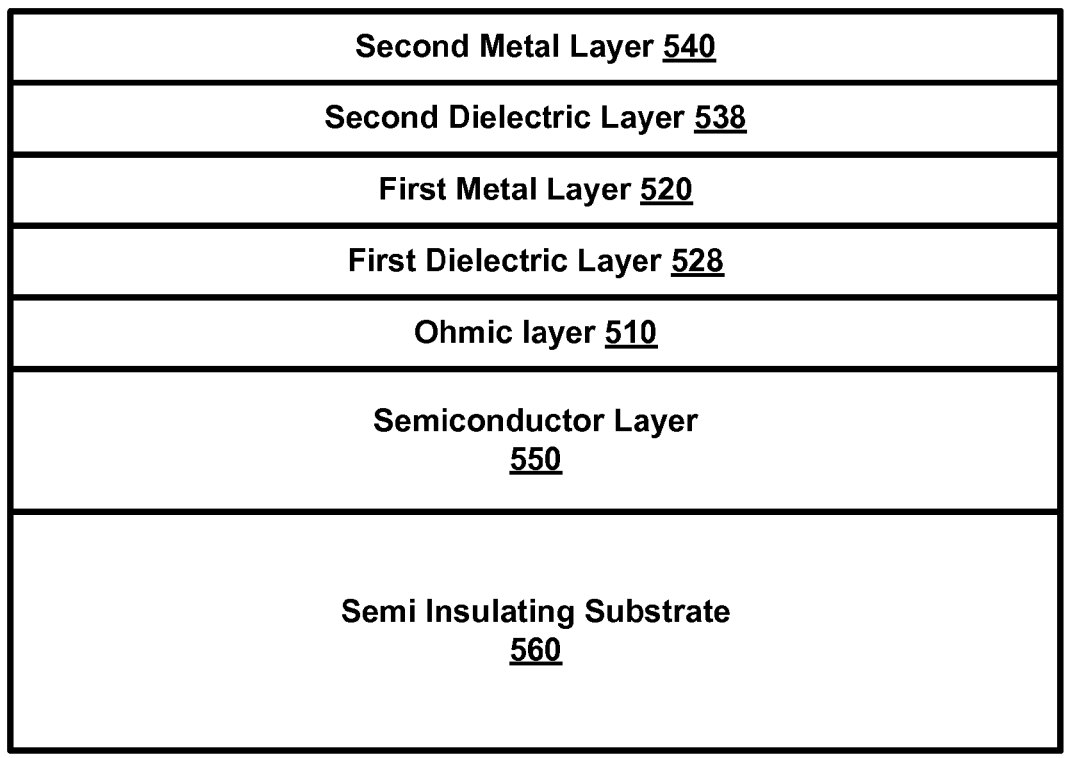
FIG. 14 is a block diagram of a side elevation illustrating layers of the FET device of FIGS. 5-7.

FIG. 5 is a perspective cutaway view of a block diagram for a FET device 500 according to various aspects of the technology. FIG. 6 is a top plan view of the cut-away of the FET device 500 of FIG. 5. FIG. 7 is an exploded view without cutaway of the FET device 500 of FIG. 5. FIG. 14 is a block diagram of a side elevation illustrating layers of the FET device 500 of FIGS. 5-7. The arrangement of the components of the device 500 may provide a solution to a number of problems in scaling a compound semiconductor FET down to a smaller size. The FET device 500 includes a semiconductor layer 550 and an ohmic layer 510 disposed on the semiconductor layer 550. The semiconductor layer 550 may be a P-type or N-type semiconductor and may be fabricated using compound semiconductors such as GaAs and GaN. The semiconductor layer may be disposed on an insulating or semi-insulating substrate 560. Examples of an insulating substrate layer include GaAs, Si-carbide, Si, and sapphire. During fabrication the insulating substrate layer may be ground down to 50-100 microns. The FET device 500 further includes a first dielectric layer 528 disposed on the ohmic layer 510, and a first metal layer 520 disposed on the first dielectric layer 528. The FET device 500 further includes a second dielectric layer 538 disposed on the first metal layer and a second metal layer 540 disposed on the second dielectric layer. The first dielectric layer 528 may cover a substantial portion or the entire surface of the FET device 500, including ohmic metal, gate metal and the exposed surface of the epitaxial layer between the gate metal and the ohmic metal. The first dielectric layer 528 may seal the covered surface and/or any embedded structures (e.g., vias) from the outside environment, protecting against accidental damage and exposure to microscopic particles. This, in turn, may eliminate the need for an external package which is often required to achieve such a level of environmental protection. Similarly, the second dielectric layer 538 may cover, seal, and/or protect the second metal layer 540. The first dielectric layer 528 and/or the second dielectric layer 538 may hermetically seal the device surface. In various embodiments, the first and second dielectric material includes silicon dioxide, silicon oxide, fluorine-doped silicon dioxide, carbon-doped silicon dioxide, porous silicon dioxide, porous carbon-doped silicon dioxide, and/or the like. The first dielectric layer 528 and second dielectric layer 538 as shown in FIG. 14 are omitted in FIGS. 5-7 for clarity.

Figure 8:
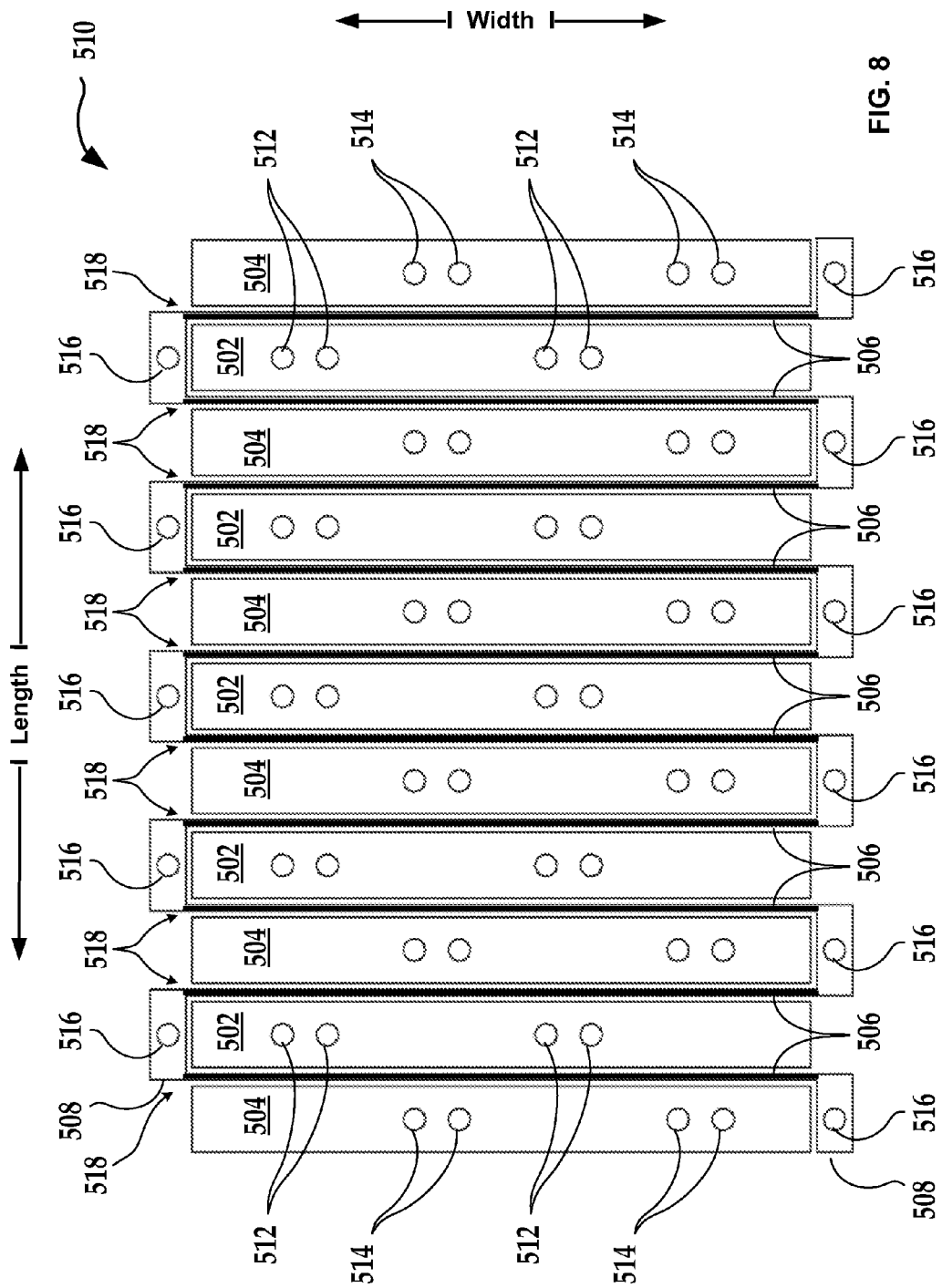
FIG. 8 illustrates details of an arrangement of the ohmic layer of FIG. 5.

FIG. 8 illustrates details of an arrangement of the ohmic layer 510 of FIG. 5. The ohmic layer 510 includes source fingers 502 alternating with drain fingers 504. A gate finger 506 is disposed in a gate channel 518 between each adjacent source finger 502 and drain finger 504. Ohmic metals provide low resistance contact to the semiconductor layer 550. The structure of the source fingers 502 and drain finger 504 includes ohmic metal. The source fingers 502 and drain fingers 504 may be fabricated using an alloyed metal structure forming ohmic metal deposited on a respective source finger 502 region and drain finger 504 region of doped semiconductor. In various embodiments, the alloyed metal structure includes one or more layers of Ni, Ge, Au, Cu, etc., in various alloys and combinations of layers. The wafer may be heated so that the metals alloy (or diffuse) into the epitaxial layer creating the low resistance connections. Source fingers 502 and drain fingers 504 may function interchangeably.

The gate fingers 506 comprise a set or layers of various combinations and/or alloys of deposited metals (e.g., Ti, Pt, Au, Al, Ti, and/or W). The deposited metals form a Schottky contact with the surface of the epitaxial layer, creating the Schottky diode structure in the region of epitaxial layer that comprises the gate region. The gate channel 518 may provide spacing for the gate fingers 506 between the source fingers 502 and the drain fingers 504. In various embodiments, the length of the gate channel 518 is about 0.1, 0.25, 0.5, 1, 2, 3, 4, 5, 6, 7, 8, 9, 10, or more microns. While the gate fingers 506 may not employ ohmic metals they are included as part of the ohmic layer 510.

Figure 9:
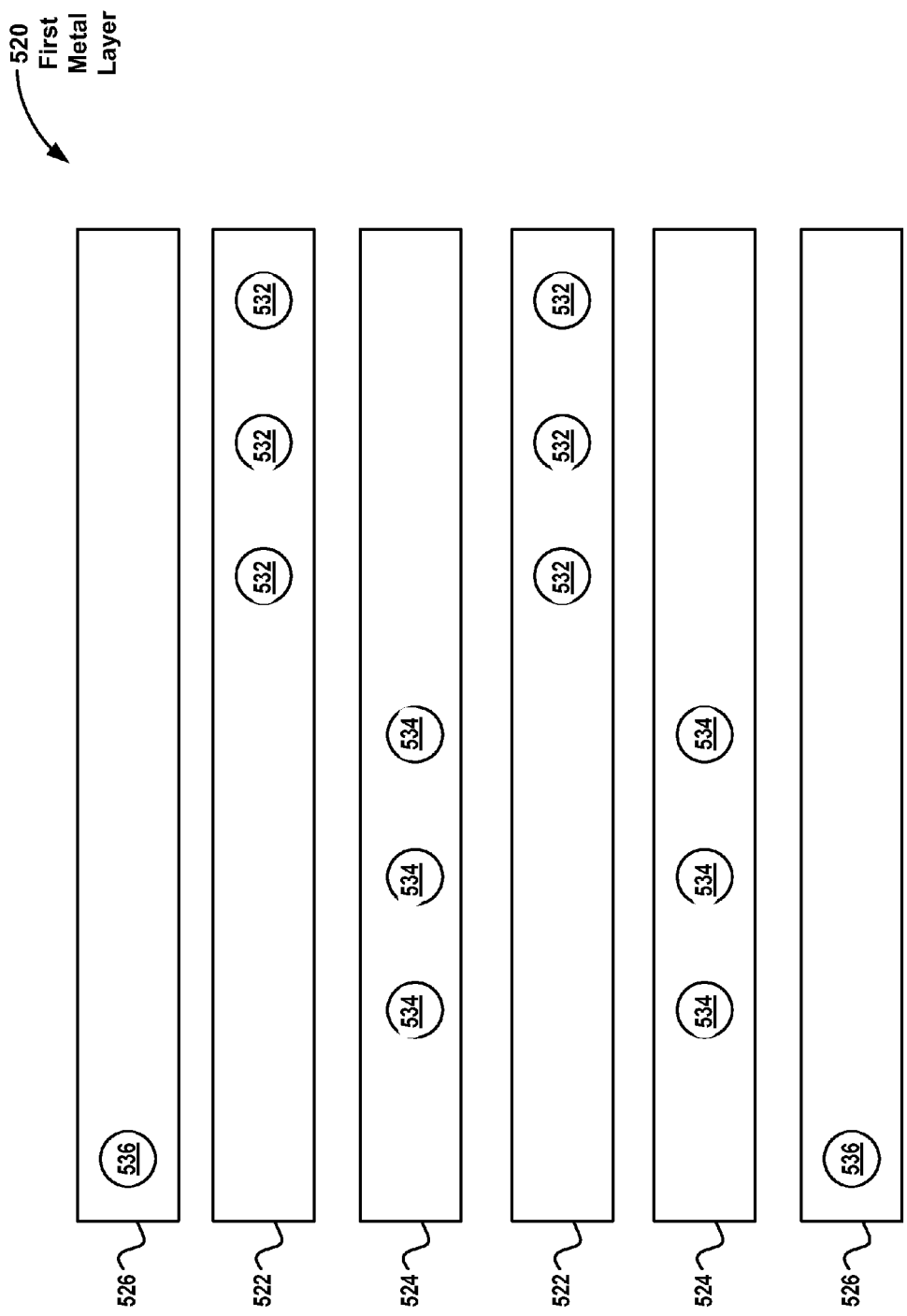
FIG. 9 illustrates details of the topology of the first metal layer of FIG. 5.

FIG. 9 illustrates details of the topology of the first metal layer 520 of FIG. 5. The first metal layer includes source electrodes 522, drain electrodes 524, and gate electrodes 526 which are disposed on the first dielectric layer 528. Source electrodes 522, drain electrodes 524, and gate electrodes 526 are configured to carry substantially more current without failing than the ohmic metal of the source fingers 502 and drain fingers 504. Further, source electrodes 522, drain electrodes 524, and/or gate electrodes 526 may be a very good heat conductor and configured to conduct heat substantially more efficiently than the semiconductor layer 550 and/or the insulating substrate 560.

Referring to FIG. 5-FIG. 9, source vias 512 disposed on the source fingers are connected to source electrodes 522 and are configured to couple source current between the source fingers 502 and the source electrodes 522. Drain vias 514 disposed on the drain fingers 504 are connected to drain electrodes 524 and are configured to couple drain current between the drain fingers 504 and the drain electrodes 524. Gate vias 516 disposed on gate pads 508 are connected to gate electrodes 526 and are configured to couple a gate signal between the gate bonding pads 508 and the gate electrodes 526. The source vias 512, drain vias 514, and gate vias 516 may be embedded in the first dielectric layer 528. The first dielectric layer 528 may cover the entire surface of the ohmic layer 510 of the FET device 500, which may have the effect of embedding the vias and sealing the ohmic metal and/or gate metal from the outside environment and may reduce a need for an external package to protect the FET device 500. In various embodiments, source vias 512, drain vias 514, gate vias 516, source electrodes 522, drain electrodes 524, and/or gate electrodes 526 are fabricated using Au, Cu, Al, W, Ag, and/or the like. In some embodiments, the source vias 512, the drain vias 514, and/or gate vias 516 are fabricated during the same step as the source electrodes 522, drain electrodes 524, and gate electrodes 526, respectively, and may be contiguous with the respective electrodes.

As can be seen in FIG. 8, each gate finger 506 receives a gate signal from gate pads 508 disposed on either end of the gate finger 506. Thus, each gate finger 506 may receive a gate signal from both ends. This is different from the standard FET structure as illustrated in FIG. 1 where the gate fingers 106 are all connected to a single large gate bonding pad 116 disposed on one end of the gate fingers 106. The gate bonding pads 508 of FIG. 8 are each configured to contact two gate fingers 506 in an alternating (meander or serpentine) pattern such that each end of each gate finger 506 is connected to one gate bonding pad 508. The meander pattern in FIG. 8 may improve yield by reducing lift-off problems which are characteristic of enclosed features during fabrication. In alternative embodiments (not illustrated), each gate bonding pad 508 may be configured to contact more than two of the ends of the gate fingers 506.

The serpentine structure for the gate fingers 506 and gate pads 508 illustrate in FIG. 8 addresses a problem contributing to low yield due to breaks in the gate fingers 506 discussed elsewhere herein. A major yield driver for typical power and/or switching FET devices is breaks in the gate fingers due to defects during fabrication. Such breaks can result, for example, from particles on the order of a micron deposited during the fabrication process. For a device that has been scaled down to increase gate periphery, such as illustrated in FIG. 4, one micron may be several gate lengths (where one gate length is typically 0.25-0.5 microns). If the gate signal were to be applied through the gate bonding pad 116 from only one end of the gate fingers 106 illustrated in FIG. 1, any such break may leave a portion of the gate finger 106 that is beyond the discontinuity and unconnected from its voltage source (gate signal). As a result, the portion of the gate finger 106 beyond the break would be unable to control the current flowing in that section of the channel 118, thus, rendering the FET device 100 incapable of acting as a switch or power device.

However, when each gate finger 506 receives the gate signal from two independent points on either end as illustrated by the serpentine pattern in FIG. 8, such a break becomes a non-fatal flaw. The gate signal can reach all portions of the gate fingers 506 on either side of the break. A section of one of the gate fingers 506 can become unconnected, and thus, uncontrolled, only if there are two breaks in the same gate finger 506. However, the probability of two breaks in the same gate finger 506 may be a low as less than 0.04%. The impact on yield can be illustrated in the following example calculations:

Suppose a switch and/or power FET device has 250 gate fingers each 4 mm in width, representing a total gate periphery of one meter. Further suppose that the probability ($Y_0$) of any single 1-mm segment of gate finger not having a break is about 99.9%, which is a typical fabrication yield for such devices. Then the probability ($Y_f$) of there not being a break in any one entire 4-mm gate finger would be about:

$$Y_f = Y_0^4 = 99.6\%$$

Thus, the probability ($Y_t$) of no breaks in any one of the 250 gate fingers is about:

$$Y_t = Y_f^{250} = 36.8\%$$

As a result, the overall device yield for a FET device such illustrated in FIG. 1 where all the gate fingers receive a gate signal from one end only, is $Y_t$ or less than 40%.

Now consider the case where it takes two independent breaks in a single gate finger to cause the device to fail, such as illustrated in FIG. 8. The probability ($Y_d$) of having less than two breaks in a single gate finger is about:

$$Y_d = 1-(1-Y_f)^2 = 99.998\%$$

For the overall device, the probability (Ydt) that there are no such double breaks is about:

$$Y_{dt} = (1-[1-Y_f]^2)^{250} = 99.6\%$$

Thus, the overall device yield in the case where the gate fingers receive the gate signal independently from both ends, as illustrated in FIG. 8, is nearly 100%. In various embodiments, the length of gate fingers 506 can be 1, 0.5, 0.25, 0.15, microns or smaller. In some embodiments, the length of gate fingers 506 can be 100, 50, 25 nanometers or smaller.

The structure illustrated in FIGS. 5-9 further solves the problem of providing the source signal to the source fingers 502 without using conventional air bridge technology such as illustrated in FIG. 1. The structure illustrated in FIG. 8 also provides for high current operation without using the wide source and drain metal fingers (illustrated in FIG. 1 and FIG. 3) that are used to handle the large current densities from the air bridge contacts 112 and drain bonding pad 114, respectively. The diameter of source vias 512, drain vias 514, and gate vias 516, may be 0.25, 0.5, 1, 2, 3, 4, 5, 6, 7, 8, 9, 10, 15, 20 microns and are typically on the order of one to three microns in diameter. Referring to FIGS. 5-9, the source vias may provide a connection between each source electrode and source finger 502 that is less than the length of the source finger. Thus, the source finger 502 may be less than 8, 7, 6, 5, 4, 3, 2, 1 or 0.5 microns in length. Multiple source vias 512 provide for distributing the source current along the source fingers 502. Current from each source via 512 may flow through a section around the source finger 502 in a region of the source via 512 and out to a point about halfway to an adjacent source via 512. Thus, separate current segments are distributed in parallel to a region around each source via 512 for reducing the current density along the source fingers 502.

Referring to FIG. 8 and FIG. 9, the source vias 512 are conductors that are distributed along the width of the source fingers 502 to distribute source current. Source current may be partitioned into a plurality of source current segments for distribution through the source vias 512 along the width of a source finger 502. Each source via 512 may conduct a segment of the partitioned source current to a section of the source finger 502 proximate the respective source via 512. Each of the source electrodes 522 may distribute a segment of the source current to a section of a source finger 502. Each source electrode 522 may be in electrical contact with at least one of a plurality of the source vias 512 along a width of a source finger 502. The source electrodes 522 may be disposed on the first dielectric layer 528 along the width of the source fingers 502. As illustrated in FIG. 5, the source electrodes 522 may be oriented to cross the source fingers 502 at about right angles. Each source electrode 522 may be electrically coupled through at least one of the source vias 512 embedded in the dielectric layer to a section of each of one or more source fingers 502. In various embodiments, a pitch of the source electrodes 522 along the width of the source fingers 502 is less than about 60, 50, 40, 30, 20, 10, 5, 1, 0.5, or 0.25 microns.

Similarly, multiple drain vias 514 provide for distributing the drain current along the drain fingers 504, thus, reducing the current density in the drain fingers 504. The drain vias 514 are conductors that are distributed along the width of the drain fingers 504 to distribute drain current. Drain current may be partitioned into a plurality of drain current segments for distribution through the drain vias 514 along the width of a drain finger 504. Each drain via 514 may conduct a segment of the partitioned drain current to a section of the drain finger 504 proximate the respective drain via 514. Each of the drain electrodes 524 may distribute a segment of the drain current to a section of a drain finger 504. Each drain electrode 524 may be in electrical contact with at least one of a plurality of the drain vias 514 along a width of a drain finger 504. The drain electrodes 524 may be disposed on the first dielectric layer 528 along the width of the drain fingers 504. As illustrated in FIG. 5, the drain electrodes 524 may be oriented to cross the drain fingers 504 at about right angles. Each drain electrode 524 may be electrically coupled through at least one of the drain vias 514 embedded in the dielectric layer to a section of each of one or more drain fingers 504. In various embodiments, a pitch of the drain electrodes 524 along the width of the drain fingers 504 is less than about 60, 50, 40, 30, 20, 10, 5, 1, 0.5, or 0.25 microns.

The gate periphery (the product of the number of gate fingers times the average width of each gate finger) may be driven by the sizes of the source fingers 102, the drain fingers 104, the channels 118, and the gate fingers 106. Smaller lengths may reduce the size of a device and larger widths of these features may increase the gate periphery. In various embodiments, the gate periphery of the FET device 500 is about 200, 300, 400, 500, 600, 700, 800, 900, 1,000, 1,500, 2,000 or more microns.

Figure 10:
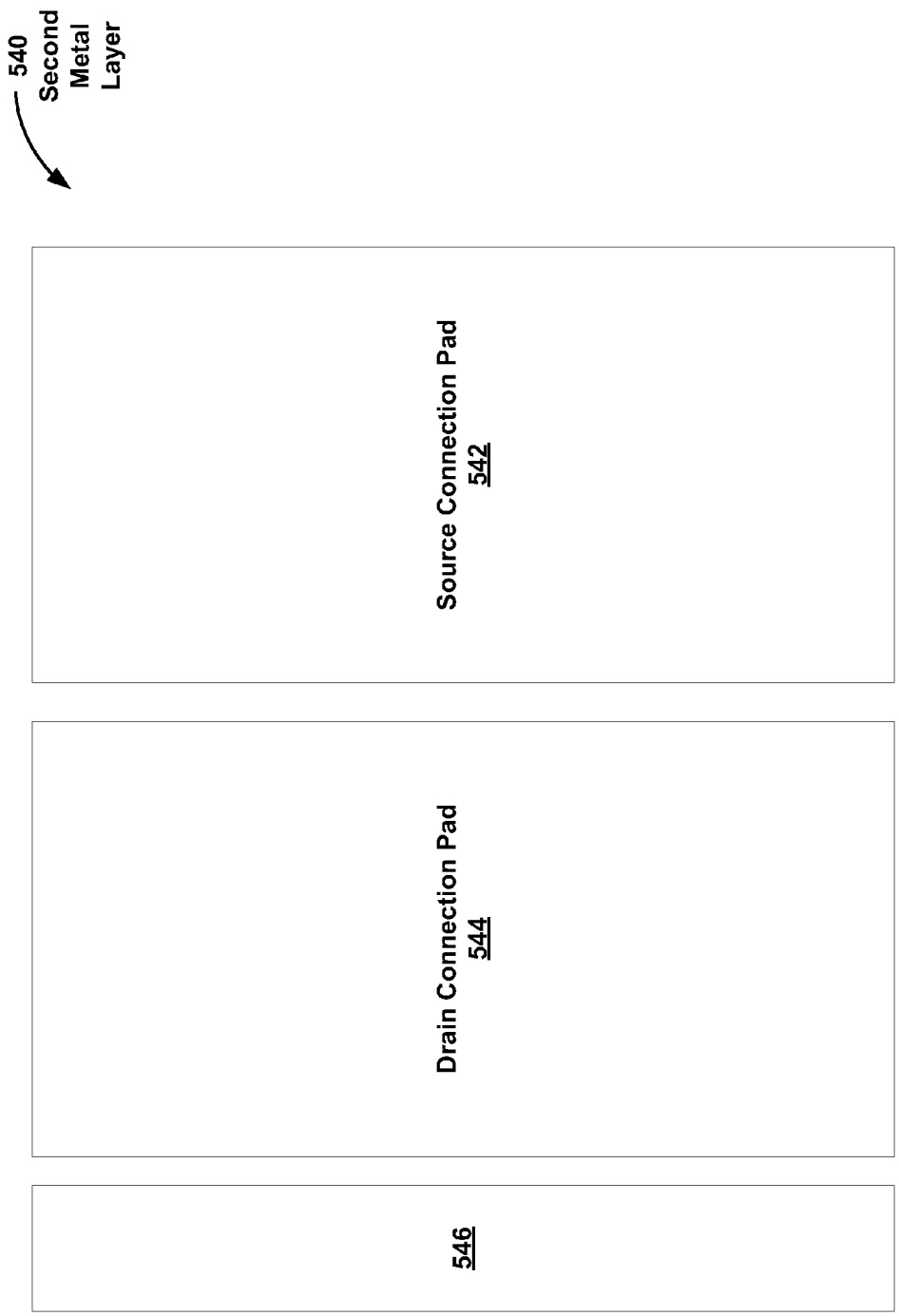
FIG. 10 illustrates details of a second metal layer of FIG. 5.

FIG. 10 illustrates details of a second metal layer 540 of FIG. 5. The second metal layer includes a source connection pad 542, a drain connection pad 544 and a gate connection pad 546. The source connection pad 542 is configured to provide connection for source current between the FET device 500 and a circuit board and/or another device. The drain connection pad 544 is configured to provide connection for drain current between the FET device 500 and a circuit board and/or another device. The gate connection pad 546 is configured to provide connection for gate signals from the FET device 500 to a circuit board and/or another device. In some embodiments, the circuit board may carry the source current, drain current, and/or gate signal to other devices, e.g., in a converter circuit. The source connection pad 542, drain connection pad 544 and/or gate connection pad 546 may be connected directly to other devices.

Referring to FIG. 9 and FIG. 10, metal vias are disposed between the first metal layer 520 and second metal layer 540. The metal vias may be embedded in the second dielectric material. The metal vias, include source vias 532, drain vias 534, and gate vias 536. The source vias 532 are configured to connect the source electrodes 522 to the source connection pad 542. The drain vias 534 are configured to connect the drain electrodes 524 to the drain connection pad 544. The gate vias 536 are configured to connect the gate electrodes 526 to the gate connection pad 546.

When a wafer is singulated into individual FET devices, the source connection pad 542, drain connection pad 544, and gate connection pad 546 enable the die to be bonded onto a carrier substrate or package using standard bumping and surface mount technologies. Note that because of the bilateral nature of the FET structure itself, current can flow through the switch or power device in either direction and the source and drain elements and contacts are effectively interchangeable.

While FIGS. 5-10 illustrate a device including components comprising five source fingers 502, six drain fingers 504, ten gate fingers 506, two source electrodes 522, two drain electrodes 524, two gate electrodes 526, one source connection pad 542, one drain connection pad 544, and one gate connection pad 546, more or fewer of each may be used for fabrication of the device of FIGS. 5-10. Also, more or fewer source vias 512, source vias 532, drain vias 514, drain vias 534, gate vias 516, and/or gate vias 536 may be used to for fabrication of the FET device 500. FIGS. 1-13 are not to scale.

Figure 11:
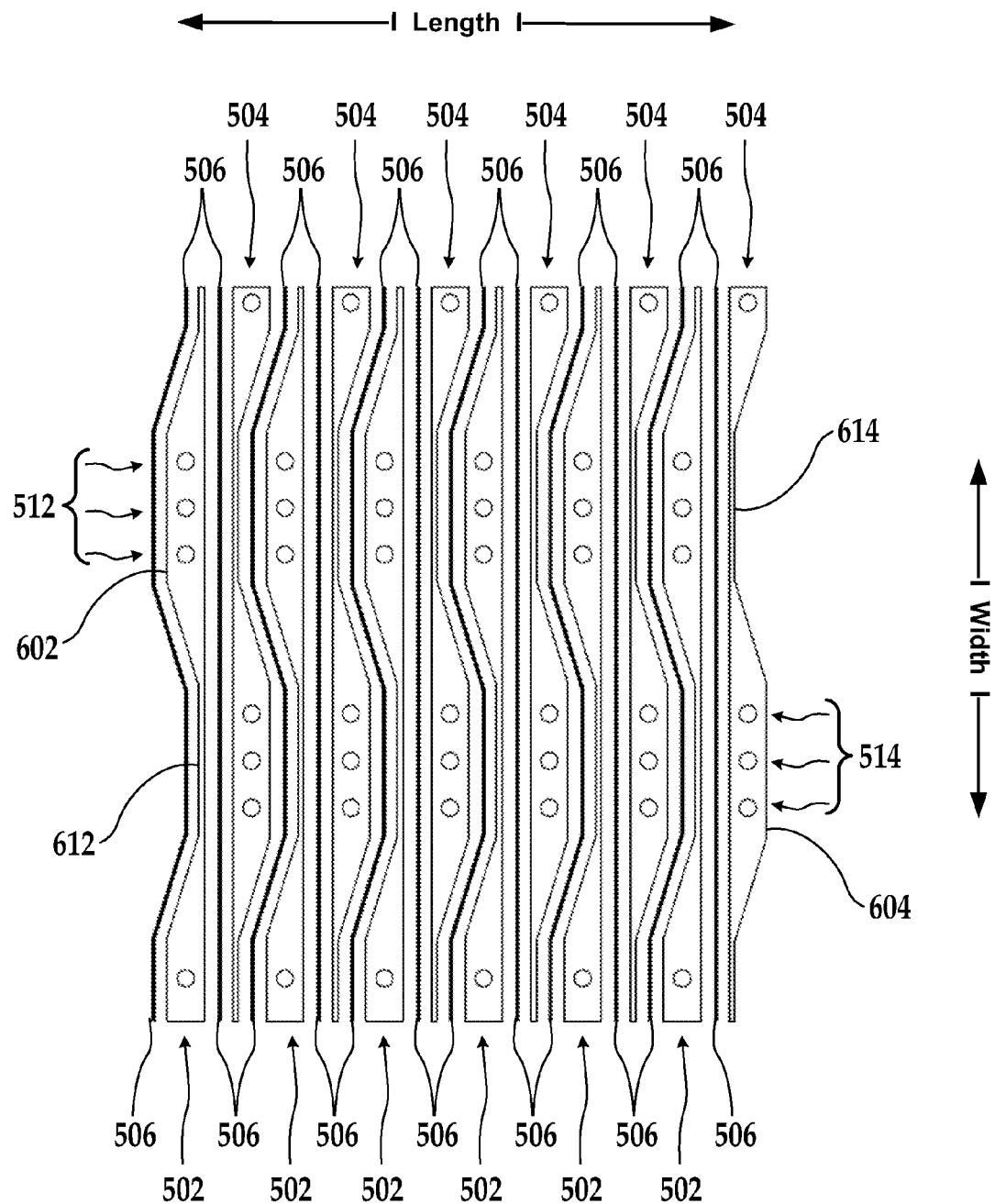
FIG. 11 illustrates an alternative embodiment of the layout illustrated in FIG. 8, in accordance with various aspects of the invention.
Figure 12:
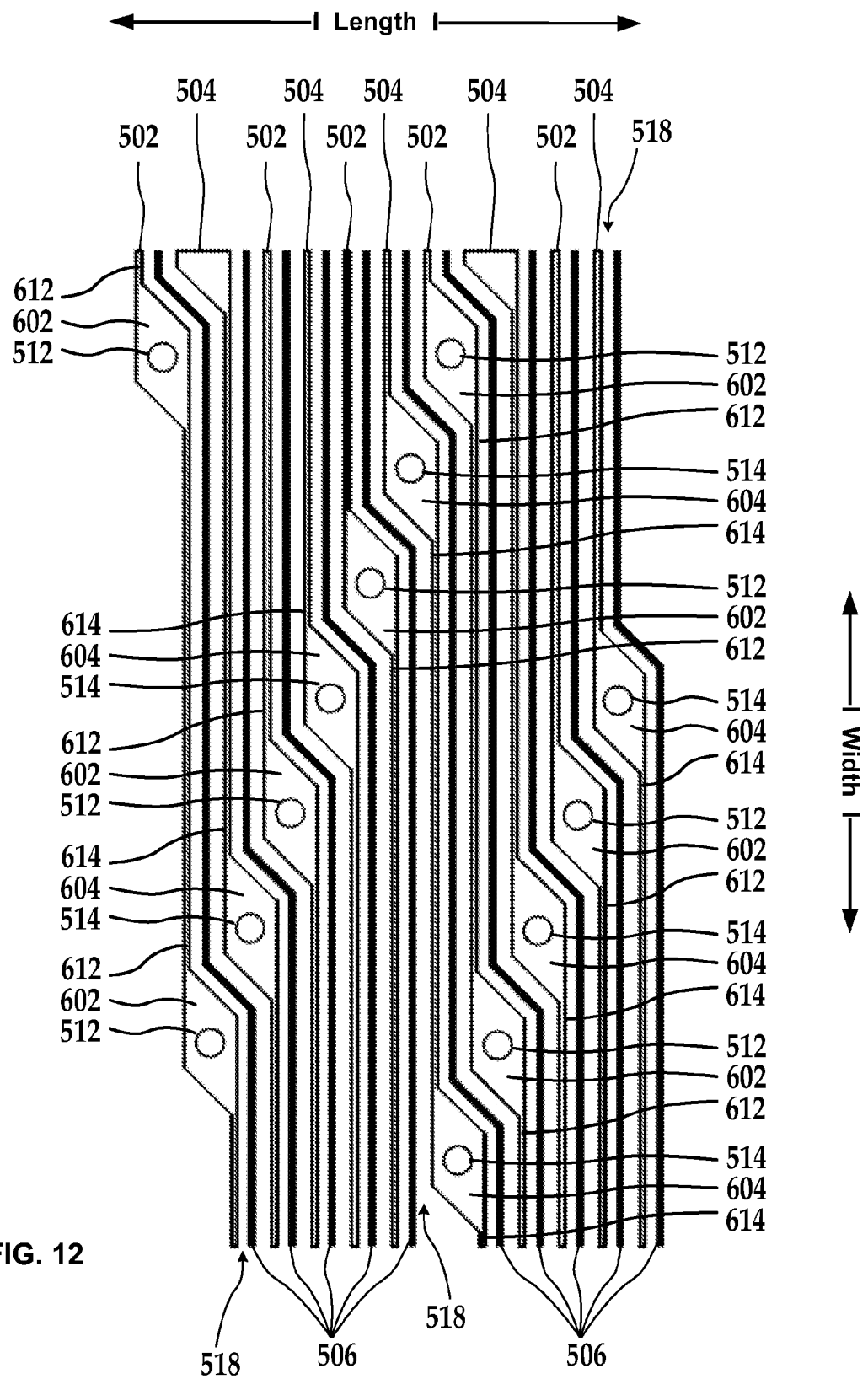
FIG. 12 illustrates an alternative embodiment of the layout illustrated in FIG. 8, in accordance with various aspects of the invention.
Figure 13:
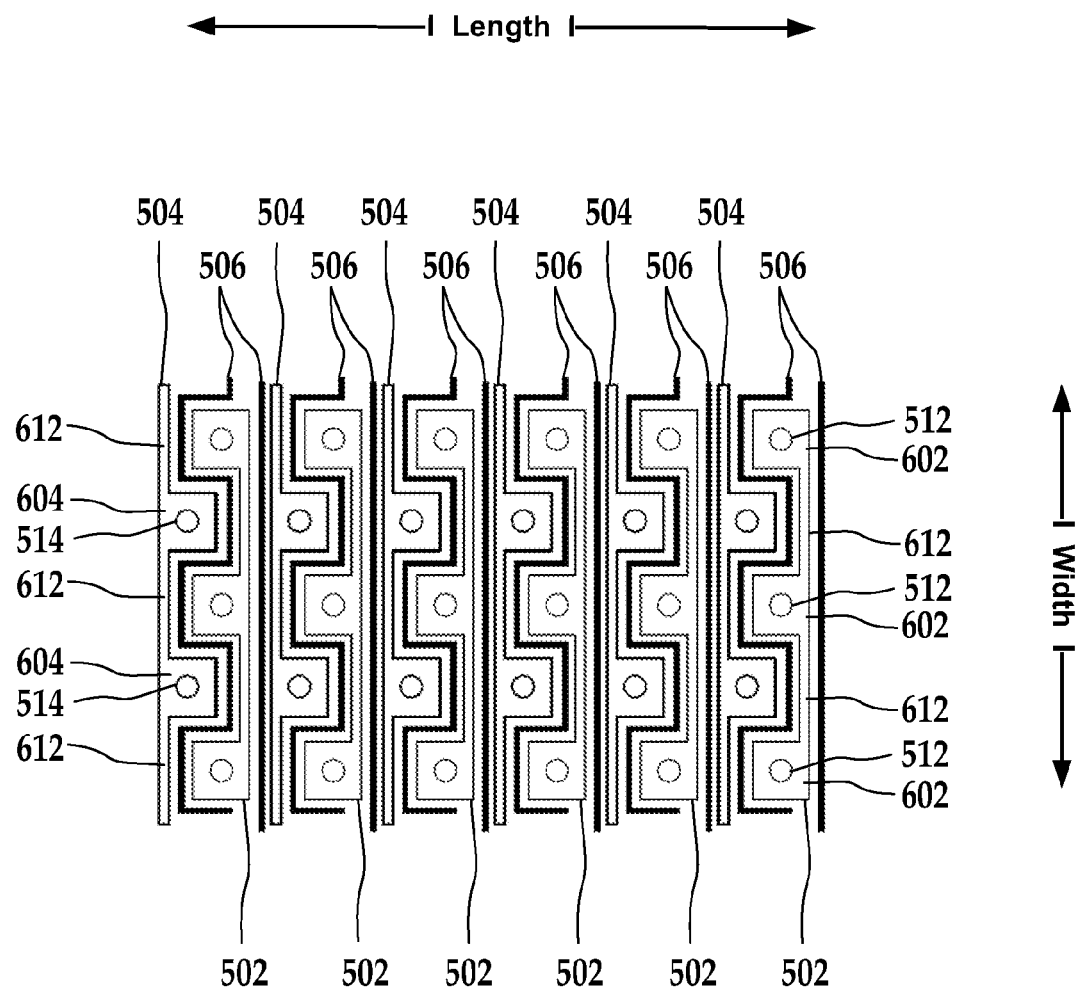
FIG. 13 illustrates an alternative embodiment of the layout illustrated in FIG. 8, in accordance with various aspects of the invention.

FIGS. 11-13 illustrate alternative embodiments of the layout illustrated in FIG. 8, in accordance with various aspects of the technology. The gate bonding pads 508 are omitted for simplicity. In FIGS. 11-13, source fingers 502 include source pads 602 and source lines 612. Similarly, drain fingers 504 include drain pads 604 and drain lines 614. The pads may be larger than the lines to accommodate vias. The source pads 602 are locations for source vias 512 distributed along the width of the source fingers. Similarly, the drain pads are locations for drain vias 514 distributed along the width of the drain pads. The sizes of the source pads 602 and drain pads 604 may be configured to support the source vias 512 and drain vias 514, respectively. Thus, the length of the source fingers 502 and the drain fingers 504 may be decreased and may be smaller than the length of the source pads 602 and drain pads 604, respectively. The source pads 602 and the drain pads 604 are distributed along the width of the source fingers 502 and drain fingers 504, respectively.

The layout 1100 of FIG. 11 illustrates an alternative embodiment of the layout of the ohmic layer 510 illustrated in FIG. 5 and in more detail in FIG. 8, in accordance with various aspects of the invention. FIG. 11 shows source line 612 and drain line 614 having a length as small as 0.25-1.5 micron. Such length may be adequate for most switch applications provided the distance along the width axis which current must travel on the source line 612 and drain line 614 is short enough that the contribution to the total resistance of the source finger 502 and drain finger 504 is small. The source lines 612 may alternate with source pads 602 to reduce current density in each source line 612. Similarly, the drain lines 614 may alternate with drain pads 604 to reduce current density in each drain line 614. The positions of the source pads 602 may be offset relative to drain pads 604. Thus, the overall surface area required to accommodate a given amount of gate periphery can be further reduced. For example, the structure shown in FIG. 11 may be 33% more area efficient than the layout illustrated in FIG. 8.

The layout 1200 of FIG. 12 illustrates an alternative embodiment of the layout of the ohmic layer 510 illustrated in FIG. 5 and in more detail in FIG. 8, in accordance with various aspects of the invention. The layout 1300 of FIG. 13 illustrates an alternative embodiment of the layout of the ohmic layer 510 illustrated in FIG. 5 and in more detail in FIG. 8, in accordance with various aspects of the invention. The layout of FIG. 12 may be used for applications that involve switching or controlling relatively low currents. Referring to FIGS. 12 and 13, the source pads 602 and drain pads 604 may be configured for supporting vias 512 and 514, respectively. The source lines 612 are disposed between adjacent source pads 602. The drain lines 614 are disposed between adjacent drain lines 614. The source pads 602 and drain pads 604 may be further separated and their size reduced by reducing the number of vias 512 and 514, respectively, to as few as one, as illustrated in FIG. 12. Thus, the area used to support a given amount of gate periphery may be further compacted. The example shown in the FIG. 12 may have a ratio of gate periphery to overall surface area of about 0.143 µm/µm². As the separation between source pads 602 and/or drain pads 604 becomes greater, the ratio of gate periphery to overall surface area may asymptotically approach about 0.167, for example where the source fingers 502 and drain fingers 504 have a length of about one micron one and the gate channel 518 has a length of about five microns.

While the layout illustrated in FIGS. 11-13 illustrates alternative embodiments of the layout of the ohmic layer 510 additional alternative layouts employing the similar general design principles are also possible. In various embodiments illustrated in FIGS. 11-13, the source pads 602 may be separated by source lines 612 of about 1, 2, 3, 4, 5, 10, 15, 20, 30, 40, 50 microns or more in width. Similarly, the drain pads 604 may be separated by drain lines 614 of about 1, 2, 3, 4, 5, 10, 15, 20, 30, 40, 50 microns or more in width. In various embodiments illustrated in FIGS. 11-13, each source pad 602 and/or drain pad may include 1, 2, 3, 4, 5, 10 or more vias.

Table 1 illustrates an exemplary comparison of various parameters for a layout for a prior art power FET as illustrated in FIG. 1, and embodiments of compound semiconductor FET devices such as illustrated in FIGS. 5, 11, 12, and 13. The column labeled "Gate Periphery" represents total gate periphery in microns that are within an exemplary unit cell, which may be determined as the product of the number of gates and the width of the gates. The column labeled "Length" and "Width" represent the length and width, respectively, in microns of the unit cell. The column labeled "Ratio" represents the ratio of the total gate periphery to the area of the unit cell (Length×Width). The units for the ratio of the total gate periphery to the unit cell area are microns and square microns, respectively. The areas in the column labeled "Die Area" represents calculated area in square millimeters for a device having a total gate periphery of about 1 meter (1,000 millimeters). The column labeled "Gross Die/Wafer" represents an estimate of the number of die that may be fabricated on a wafer that has either a 4 inch diameter (4" column) or a 6 inch diameter (6" column).

TABLE 1

|  | Unit Cell | | | Ratio | Die | Gross | |
|  | Gate | | | µm/ | Area | Die/Wafer | |
|  | Periphery | Length | Width | µm² | (mm²) | 4" | 6" |
| Prior Art Power FET (FIG. 1) | 200 | 70 | 100 | 0.029 | 35 | 224 | 504 |
| FET illustrated in FIG. 5 | 600 | 72 | 100 | 0.083 | 12 | 638 | 1,436 |
| FET illustrated in FIG. 11 | 800 | 72 | 100 | 0.111 | 9 | 844 | 1,898 |
| FET illustrated in FIG. 12 | 600 | 42 | 100 | 0.143 | 7 | 1,075 | 2,420 |
| FET illustrated in FIG. 13 | 248 | 36 | 48 | 0.144 | 7 | 1,180 | 2,530 |

As used in this specification, the terms "include," "including," "for example," "exemplary," "e.g.," and variations thereof, are not intended to be terms of limitation, but rather are intended to be followed by the words "without limitation" or by words with a similar meaning. Definitions in this specification, and all headers, titles and subtitles, are intended to be descriptive and illustrative with the goal of facilitating comprehension, but are not intended to be limiting with respect to the scope of the inventions as recited in the claims. Each such definition is intended to also capture additional equivalent items, technologies or terms that would be known or would become known to a person having ordinary skill in this art as equivalent or otherwise interchangeable with the respective item, technology or term so defined. Unless otherwise required by the context, the verb "may" indicates a possibility that the respective action, step or implementation may be performed or achieved, but is not intended to establish a requirement that such action, step or implementation must be performed or must occur, or that the respective action, step or implementation must be performed or achieved in the exact manner described.

The above description is illustrative and not restrictive. This patent describes in detail various embodiments and implementations of the present invention, and the present invention is open to additional embodiments and implementations, further modifications, and alternative constructions. There is no intention in this patent to limit the invention to the particular embodiments and implementations disclosed; on the contrary, this patent is intended to cover all modifications, equivalents and alternative embodiments and implementations that fall within the scope of the claims. Moreover, embodiments illustrated in the figures may be used in various combinations. Any limitations of the invention should, therefore, be determined not with reference to the above description, but instead should be determined with reference to the appended claims along with their full scope of equivalents.

What is claimed is:

1. A Field Effect Transistor device comprising:
a compound semiconductor layer;
a first and second source finger disposed on a surface of the compound semiconductor material;

a first and second drain finger disposed on the surface of the compound semiconductor material, and alternating with the first and second source finger;

a plurality of gate fingers disposed on the surface of the compound semiconductor material, each gate finger between an adjacent source finger and drain finger and having a first and second end, the first end of each gate finger electrically coupled to a gate signal through a first pad and the second end of each gate finger electrically coupled to the gate signal through a second pad;

a plurality of first source vias distributed along a width of the first source finger between a source via proximate each end of the first source finger;

a plurality of second source vias distributed along a width of the second source finger between a source via proximate each end of the second source finger, the first and second source vias configured to partition source current along the width of the first and second source finger, respectively;

a plurality of source conductors distributed along the width of the first and second source finger, each source conductor in electrical contact with the first source finger through contact with at least one of the first source vias and with the second source finger through contact with at least one of the second source vias;

a plurality of first drain vias distributed along a width of the first drain finger between a first drain via proximate each end of the first drain finger;

a plurality of second drain vias distributed along a width of the second drain finger between a first drain via proximate each end of the first drain finger, the first and second drain vias configured to partition drain current along the width of the first and second drain finger, respectively; and a plurality of drain conductors distributed along the width of the first and second drain finger, each drain conductor in electrical contact with the first drain finger through contact with at least one of the first drain vias and with the second drain finger through contact with at least one of the second drain vias.

2. The Field Effect Transistor device of claim 1, further comprising an insulation layer disposed between the source conductors and the source fingers and between the drain conductors and the drain fingers, the source vias and the drain vias embedded in the insulation layer.

3. The Field Effect Transistor device of claim 1, wherein the length of the first and second source finger is less than about 7 microns.

4. The Field Effect Transistor device of claim 1, wherein the length of the plurality of gate fingers is less than about 0.5 microns.

5. The Field Effect Transistor device of claim 1, wherein the length of a region of the first source finger proximate a via is greater than the length of a region of the first source finger between vias.

6. The Field Effect Transistor device of claim 1, wherein the source conductors are about normal to the source fingers.

7. The Field Effect Transistor device of claim 6, wherein the drain conductors are about parallel to the source conductors.

8. The Field Effect Transistor device of claim 1, wherein a pitch of the gate fingers is less than about 15 microns.

9. The Field Effect Transistor device of claim 1, wherein compound semiconductor material is gallium arsenide or gallium nitride.

10. The Field Effect Transistor device of claim 1, wherein the sum of the width of the gate fingers is greater than about 1.0 meter.

11. The Field Effect Transistor device of claim 1, wherein an average separation between the first source vias distributed along the width of the first source finger is less than about 10 microns.

12. A means for switching current using a Field Effect Transistor comprising:

means for segmenting source current into a plurality of source current segments;

means for distributing the plurality of source current segments to respective sections of a source finger between vias proximate each end of the source finger, the source finger disposed on a surface of a gallium arsenide compound semiconductor;

means for segmenting drain current into a plurality of drain current segments;

means for distributing the plurality of drain current segments to respective sections of a drain finger between vias proximate each end of the drain finger, the drain finger disposed on the surface of the gallium arsenide; and means for coupling a gate signal to two ends of a gate finger disposed between the source element and the gate element.

13. The means for switching current of claim 12, further comprising a plurality of electrodes each configured to conduct a segment of the source current to a section of the source finger through a via.

14. The means for switching current of claim 13, further comprising a dielectric layer between the plurality of electrodes and the source finger, the dielectric layer configured to embed the via.

15. The means for switching current of claim 12, further comprising at least one via disposed on the surface of each section of the source finger.

16. The means for switching current of claim 12, wherein an average width of the sections of the source finger is less than about 20 microns.

17. The means for switching current of claim 12, wherein the means for coupling a gate signal to two ends a gate finger includes a first gate pad coupled to the gate signal and to a first end of the gate finger, and a second gate pad coupled to the gate signal and to a second end of the gate finger.

18. A Field Effect Transistor device comprising:

a compound semiconductor layer a plurality of source fingers disposed on a surface of the semiconductor layer;

a plurality drain fingers disposed on the surface of the semiconductor layer and alternating with the source fingers;

a plurality of gates disposed between adjacent source fingers and drain fingers;

a plurality of first gate pads each configured to couple a gate signal to a first end of at least one of the gate fingers;

a plurality of second gate pads each configured to couple the gate signal to a second end of at least one of the gate fingers;

a dielectric layer disposed on the source fingers, drain fingers and gate fingers;

a plurality of source electrodes disposed on the dielectric layer along a width of the source fingers and oriented to cross the plurality of source fingers, each electrode electrically coupled through at least one via in the dielectric layer to a section of each of the source fingers; and a plurality of drain electrodes disposed on the dielectric layer along a width of the drain fingers and oriented to cross the plurality of drain fingers, each electrode electrically coupled through at least one via in the dielectric layer to a section of each of the drain fingers.

19. The Field Effect Transistor device of claim 18, wherein the length of each of the plurality of gate fingers is less than about 0.5 microns.

20. The Field Effect Transistor device of claim 18, wherein the length of each of the plurality of source fingers is less than about 7 microns.

21. The Field Effect Transistor device of claim 18, wherein a pitch of the gate fingers is less than about 15 microns.

22. The Field Effect Transistor device of claim 18, wherein the compound semiconductor is gallium arsenide or gallium nitride.

23. The Field Effect Transistor device of claim 18, wherein the sum of the widths of the gate fingers is greater than 1.0 meter.

24. The Field Effect Transistor device of claim 18, wherein a pitch of the source electrodes is less than about 30 microns.

* * * * *